(12) United States Patent
Chen et al.

(10) Patent No.: US 9,721,824 B2
(45) Date of Patent: Aug. 1, 2017

(54) WAFER BONDING METHOD AND DEVICE WITH REDUCED THERMAL EXPANSION

(71) Applicant: Industrial Technology Research Institute, Hsinchu (TW)

(72) Inventors: Kuan-Wei Chen, Taichung (TW);
Pei-Jer Tzeng, Hsinchu County (TW);
Chien-Chou Chen, Hsinchu (TW);
Po-Chih Chang, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/860,721

(22) Filed: Sep. 22, 2015

(65) Prior Publication Data
US 2016/0336211 A1 Nov. 17, 2016

(30) Foreign Application Priority Data
May 13, 2015 (TW) .............................. 104115136 A

(51) Int. Cl.
| | | |
|---|---|---|
| *H01L 21/683* | (2006.01) | |
| *H01L 29/06* | (2006.01) | |
| *H01L 21/78* | (2006.01) | |
| *H01L 21/50* | (2006.01) | |
| *H01L 23/544* | (2006.01) | |

(52) U.S. Cl.
CPC .......... *H01L 21/6835* (2013.01); *H01L 21/50* (2013.01); *H01L 21/6836* (2013.01); *H01L 21/78* (2013.01); *H01L 29/0657* (2013.01); *H01L 23/544* (2013.01); *H01L 2221/68318* (2013.01); *H01L 2221/68327* (2013.01);
(Continued)

(58) Field of Classification Search
CPC . H01L 25/0657; H01L 21/4857; H01L 25/50; H01L 23/49822; H01L 21/6835; H01L 21/50; H01L 21/78; H01L 23/544; H01L 29/0657; H05K 2201/068
See application file for complete search history.

(56) References Cited

U.S. PATENT DOCUMENTS 4,691,214 A * 9/1987 Hayakawa ............... H01L 27/15
257/84
6,406,636 B1 * 6/2002 Vaganov ............... B23K 1/0016
216/2
(Continued)

FOREIGN PATENT DOCUMENTS

| CN | 101930942 | 12/2010 |
|---|---|---|
| TW | 303484 | 4/1997 |
| TW | I239057 | 9/2005 |

OTHER PUBLICATIONS

Tong et al., "Thickness Considerations in Direct Silicon Wafer Bonding," Journal of the Electrochemical Society, Nov. 1995, pp. 3975-3979.
(Continued)

*Primary Examiner* — John C Ingham
*Assistant Examiner* — Gustavo Ramallo
(74) *Attorney, Agent, or Firm* — Jianq Chyun IP Office

(57) ABSTRACT

A bonding structure including a first substrate, a second substrate, and an adhesive layer is provided. The first substrate has a plurality of first trenches. The adhesive layer is located between the first substrate and the second substrate, and the first trenches are filled with the adhesive layer.

13 Claims, 16 Drawing Sheets

(52) U.S. Cl.
CPC ............... *H01L 2221/68381* (2013.01); *H01L 2223/5446* (2013.01); *H01L 2223/54426* (2013.01)

(56) References Cited

U.S. PATENT DOCUMENTS

| | | | |
|---|---|---|---|
| 6,436,793 | B1 | 8/2002 | Kneezel et al. |
| 7,659,182 | B2 | 2/2010 | Vaganov et al. |
| 7,846,102 | B2 | 12/2010 | Kupnik et al. |
| 7,943,411 | B2 | 5/2011 | Martin et al. |
| 7,972,683 | B2 | 7/2011 | Gudeman et al. |
| 7,994,595 | B2 | 8/2011 | Forbes et al. |
| 8,119,498 | B2 | 2/2012 | Mengi et al. |
| 8,709,913 | B2 | 4/2014 | Oganesian et al. |
| 8,987,059 | B2 | 3/2015 | Liang et al. |
| 9,070,729 | B2 | 6/2015 | Ji et al. |
| 2005/0150538 | A1* | 7/2005 | Liu ..................... H01L 35/32 136/205 |
| 2007/0295456 | A1* | 12/2007 | Gudeman ........... B81C 1/00269 156/379.7 |
| 2008/0070376 | A1* | 3/2008 | Vaganov ............... B30B 15/061 438/455 |
| 2009/0129622 | A1* | 5/2009 | Chen ..................... H04R 31/00 381/369 |
| 2009/0218669 | A1* | 9/2009 | Wang .................. H01L 21/6835 257/686 |
| 2009/0267083 | A1 | 10/2009 | Cui |
| 2013/0320404 | A1* | 12/2013 | Usenko ................. H01L 29/267 257/200 |

OTHER PUBLICATIONS

Niklaus et al., "Low temperature full wafer adhesive bonding of structured wafers," Sensors and Actuators A, Jul. 17, 2001, pp. 235-241.

Haisma et al., "Silicon-on-Insulator Wafer Bonding-Wafer Thinning Technological Evaluations," Japanese Journal of Applied Physics, Aug. 1989, pp. 1426-1443.

Koyanagi et al., "Three-Dimensional Integration Technology Based on Wafer Bonding With Vertical Buried Interconnections," IEEE Transactions on Electron Devices, Nov. 2006, pp. 2779-2808.

Turner et al., "Modeling of direct wafer bonding: Effect of wafer bow and etch patterns," Journal of Applied Physics, Dec. 15, 2002, pp. 7658-7666.

Klink et al., "Wafer bonding with an adhesive coating," Part of the SPIE Conference on Micromachined Devices and Components IV, Sep. 1998, pp. 50-61.

* cited by examiner

WAFER BONDING METHOD AND DEVICE WITH REDUCED THERMAL EXPANSION

CROSS-REFERENCE TO RELATED APPLICATION

This application claims the priority benefit of Taiwan application serial no. 104115136, filed on May 13, 2015. The entirety of the above-mentioned patent application is hereby incorporated by reference herein and made a part of this specification.

TECHNICAL FIELD

The disclosure relates to a bonding structure, a method of manufacturing the same, and a die structure.

BACKGROUND

Along with the rapid progress of science and technologies, electronic products have been designed to satisfy requirements for light weight, slimness, shortness, and compactness. Recently, in order to meet the requirement for miniaturizing the existing electronic products, various packaging technologies, such as the package-on-package (POP) structure packaging technology, have been developed.

However, during the process of bonding wafers, air bubbles or elevations may be generated in the bonding material. The wafer may be burst or cracked because of thermal expansion and contraction of the bonding material, and the wafer may then be distorted or warped. Hence, how to prevent damages to the wafer or the warp of the wafer through reducing the air bubbles or the elevations in the bonding material has become one of the important research topics.

SUMMARY

In an embodiment of the disclosure, a bonding structure including a first substrate having a plurality of first trenches, a second substrate, and an adhesive layer is provided. At least one of the first substrate and the second substrate is a wafer. The adhesive layer is located between the first substrate and the second substrate. The first trenches are filled with the adhesive layer.

In an embodiment of the disclosure, a method of manufacturing a bonding structure includes following steps. The first substrate and the second substrate are provided. The first substrate has a plurality of first trenches. A first adhesive layer is formed between the first substrate and the second substrate. The first trenches are filled with the first adhesive layer.

In an embodiment of the disclosure, a die structure including a substrate and a device portion is provided. The device portion is located on the substrate. A sidewall of the substrate is step-shaped.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
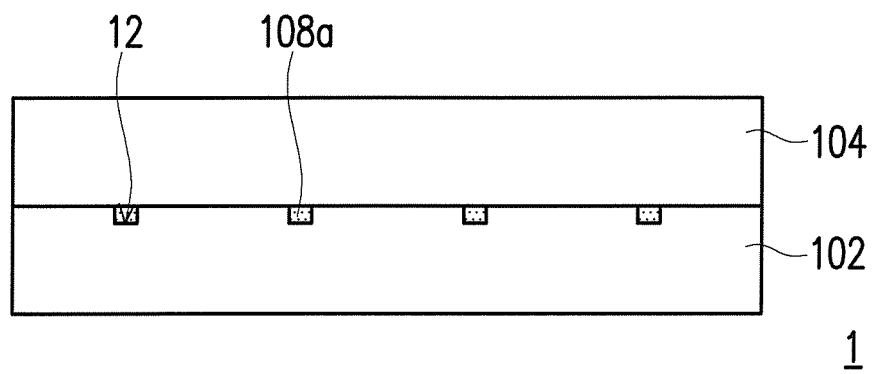
FIG. 1 is a schematic cross-sectional view of a bonding structure according to an embodiment of the disclosure.

FIG. 1 is a schematic cross-sectional view of a bonding structure according to an embodiment of the disclosure.

With reference to FIG. 1, a bonding structure 1 is provided in the embodiment. The bonding structure 1 includes a first substrate 102, a second substrate 104, and an adhesive layer 108a. At least one of the first substrate 102 and the second substrate 104 is a wafer, and the other may be a wafer, a circuit board, or a combination thereof. The wafer may have a device portion thereon, and the device portion may be an integrated circuit device, for instance. The integrated circuit device may be a transistor, a capacitor, a resistor, a diode, a photoelectric diode, a fuse device, and the like, for instance. The integrated circuit device may be connected to each other or one another, so as to perform at least one function of a memory, a processor, a sensor, an amplifier, a power distributor, an input/output circuit, or the like, for instance. Besides, the integrated circuit device may be formed by applying any appropriate method.

At least one of the first substrate 102 and the second substrate 104 has a plurality of trenches 12. In an embodiment as shown in FIG. 1, the first substrate 102 has the trenches 12. In another embodiment of the disclosure, the second substrate 104 has the trenches 12. In another embodiment of the disclosure, both the first substrate 102 and the second substrate 104 have the trenches 12. The adhesive layer 108a is located between the first substrate 102 and the second substrate 104 for adhering the first substrate 102 and the second substrate 104 to each other. The trenches 12 are filled with the adhesive layer 108a. A material for the adhesive layer 108a includes a thermal curing material, and the thermal curing material may be polyimide, epoxy resin, or a combination thereof, for instance.

Since the first substrate 102 described in the embodiment has the trenches, air bubbles or elevations in the adhesive layer 108a may be temporarily stored in the trenches 12 or may be removed from the adhesive layer 108a along the trenches 12 while the first substrate 102 and the second substrate 104 are bonded to each other. Thereby, in a curing process, the air bubbles or the elevations do not cause damages to the bonding structure or the warp of the bonding structure even though the adhesive layer 108a may be thermally expanded and contracted. In addition, due to the trenches 12 of the first substrate 102 provided in the embodiment, during the bonding process, the trenches 12 are able to disperse the force exerted on the first substrate 102 and the second substrate 104, such that the level of distortion or warp of the bonding structure may be reduced.

FIG. 2 to FIG. 6 are top views of the trenches depicted in FIG. 1 according to several embodiments of the disclosure.

The disclosure can be accomplished in many different ways and should not be limited to the embodiments set forth herein. In the drawings, the dimensions and the shape of devices may be exaggerated or enlarged for clarity of illustration. Identical or similar reference numbers represent the identical or similar devices. For instance, the first substrate 102 illustrated in FIG. 1 is identical or similar to the first substrates 102a-102e respectively depicted in FIG. 2 to FIG. 6, and therefore the descriptions of the first substrate 102 will not be further provided hereinafter.

Figure 2:
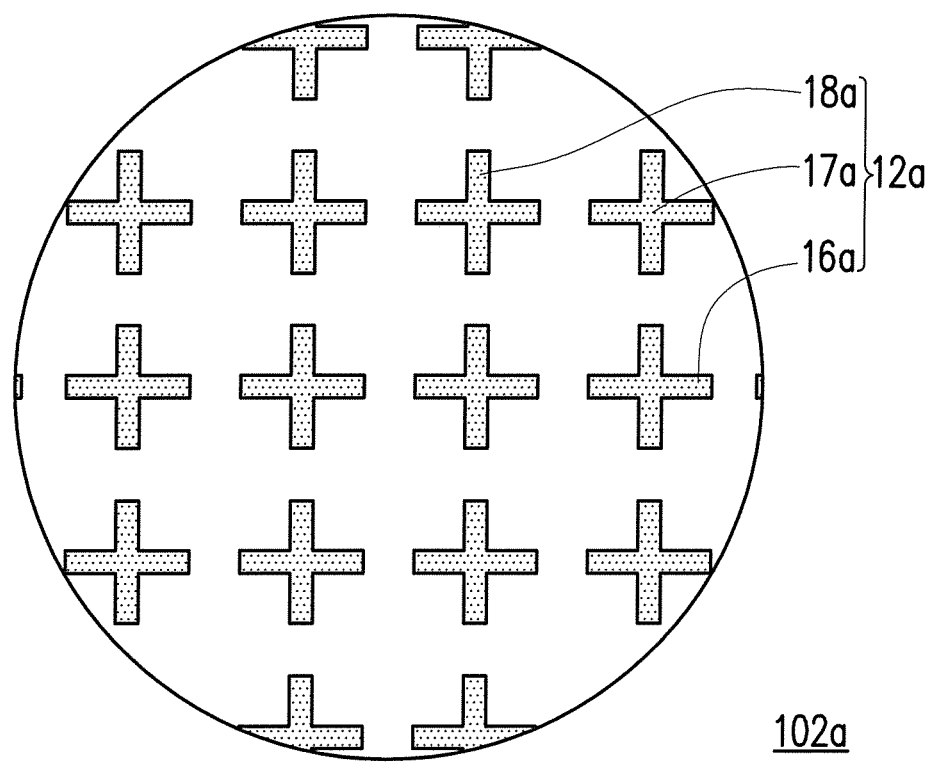
FIG. 2 to FIG. 6 are top views of the trenches depicted in FIG. 1 according to several embodiments of the disclosure.

The trenches 12 of the first substrate 102 as shown in FIG. 1 may constitute a discontinuous structure (as depicted in FIG. 2) or a continuous structure (as depicted in FIG. 3 to FIG. 6). For instance, as shown in FIG. 2, the trenches 12a of the first substrate 102a constitute a discontinuous structure. The trenches 12a may, for instance, include a plurality of units 16a, 17a, and 18a. The units 16a, 17a, and 18a are alternately arranged and are disconnected. In an embodiment of the disclosure, the units 16a and 17a are arranged in the same column, and the units 17a and 18a are arranged in the same row. The units 16a, 17a, and 18a may be arranged in an array constituted by a plurality of columns and a plurality of rows. Shapes of the units 16a, 17a, and 18a may be the same or different. In an embodiment of the disclosure, the shapes of the units 16a, 17a, and 18a may respectively be a cross shape, a rectangular shape, and a combination thereof, for instance. However, the disclosure is not limited thereto; in another embodiment of the disclosure, the units or the arrangement thereof may be adjusted in a different manner as long as the units 16a, 17a, and 18a are alternately arranged and are disconnected. Besides, in the embodiment, the units 16a, 17a, and 18a in the first substrate 102a are evenly distributed. In another embodiment of the disclosure, the density distribution of the units 16a, 17a, and 18a in the first substrate 102a may be a gradient distribution. For instance, the densities of the units 16a, 17a, and 18a from an edge area to a central area of the first substrate 102a are gradually increased. In another embodiment of the disclosure, the density distribution of the units 16a, 17a, and 18a may be adjusted according to the densities of other components or devices on the first substrate 102a.

Figure 3:
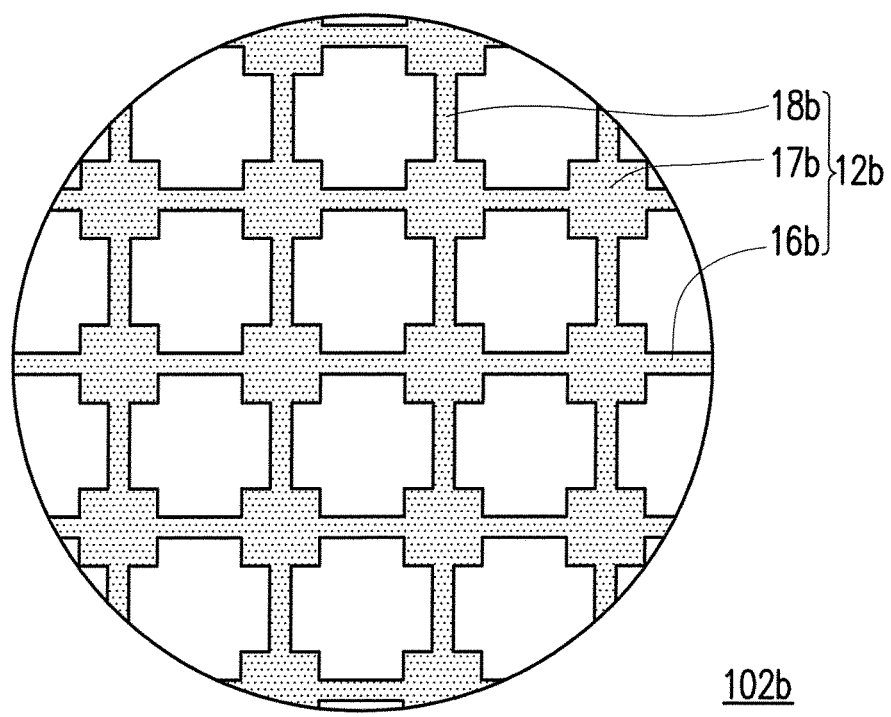
Figure 4:
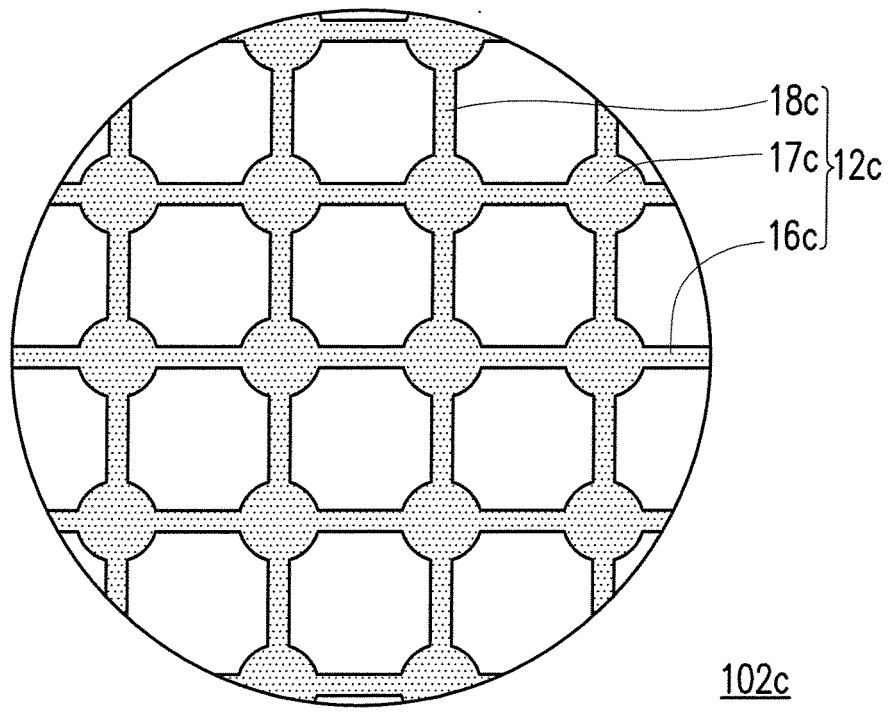
Figure 5:
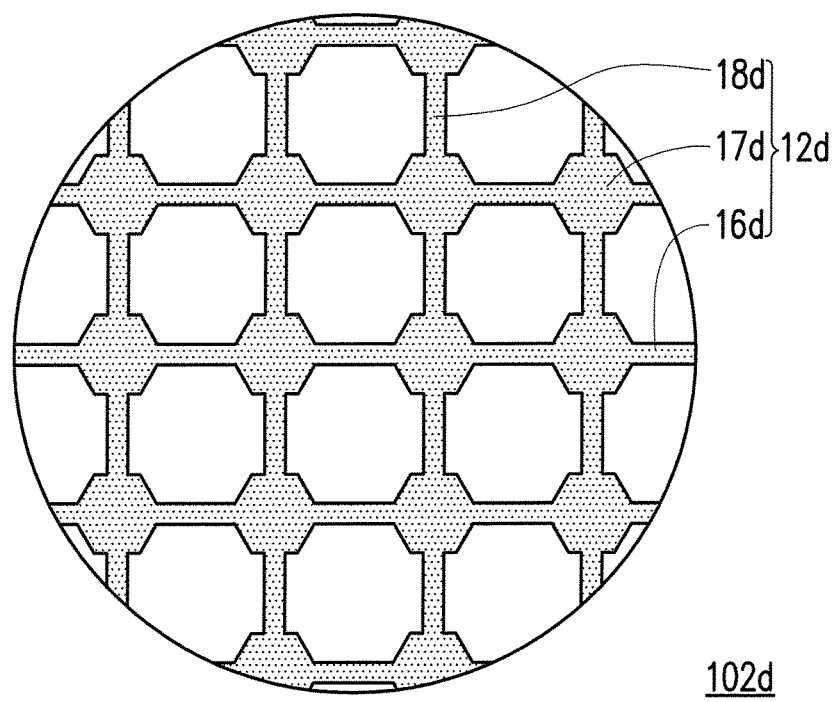
Figure 6:
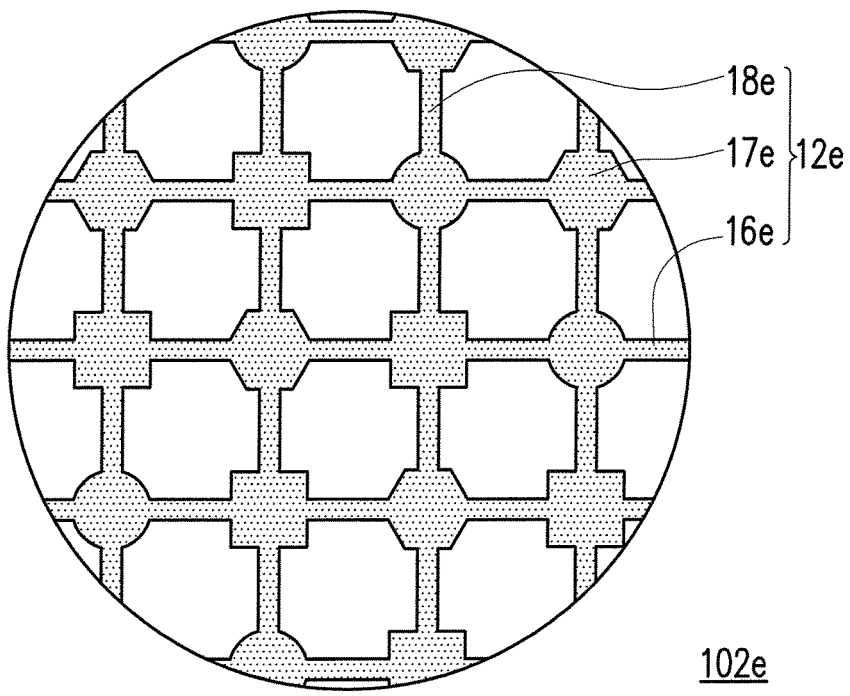

By contrast, as shown in FIG. 3 to FIG. 6, the trenches 12b, 12c, 12d, and 12e constitute a continuous structure. The trenches 12b, 12c, 12d, and 12e may include a plurality of columns and a plurality of rows. The columns and the rows intersect and are connected to constitute the continuous structure. In an embodiment of the disclosure, the continuous structure may be a checker-board structure, for instance. The dimension (e.g., the diameter or the width) of each of the intersections 17b, 17c, and 17d defined by the columns and the rows may be greater than or equal to the width of each column or each row not intersecting another row or column. Besides, the shapes of the intersections 17b, 17c, and 17d may be the same, as shown in FIG. 3 to FIG. 5; alternatively, the shapes of the intersections 17e may be different or may be partially the same, as shown in FIG. 6. The shapes of the intersections 17b, 17c, 17d, and 17e may be cross shapes, triangular shapes, rectangular shapes, circular shapes, elliptic shapes, polygonal shapes (e.g., pentagonal or hexagonal shapes), or a combination thereof, for instance.

As shown in FIG. 3, the trenches 12b of the first substrate 102b constitute the continuous structure having a plurality of columns 18b and a plurality of rows 16b. The columns 18b and the rows 16b intersect and are connected to define a plurality of intersections 17b. The shapes of the intersections 17b may be the same and may be the rectangular shapes, for instance. With reference to FIG. 4, the trenches 12c of the first substrate 102c constitute the continuous structure having a plurality of columns 18c and a plurality of rows 16c. The columns 18c and the rows 16c intersect and are connected to define a plurality of intersections 17c. The shapes of the intersections 17c may be the same and may be the elliptic shapes, for instance. With reference to FIG. 5, the trenches 12d of the first substrate 102d constitute the continuous structure having a plurality of columns 18d and a plurality of rows 16d. The columns 18d and the rows 16d intersect and are connected to define a plurality of intersections 17d. The shapes of the intersections 17d may be the same and may be the hexagonal shapes. With reference to FIG. 6, the trenches 12e of the first substrate 102e constitute the continuous structure having a plurality of columns 18e and a plurality of rows 16e. The columns 18e and the rows 16e intersect and are connected to define a plurality of intersections 17e. The shapes of the intersections 17e may be different and may be the rectangular shapes, the elliptic shapes, and the hexagonal shapes.

Processes for manufacturing the bonding structure are provided hereinafter according to several embodiments of the disclosure.

Figure 7A:
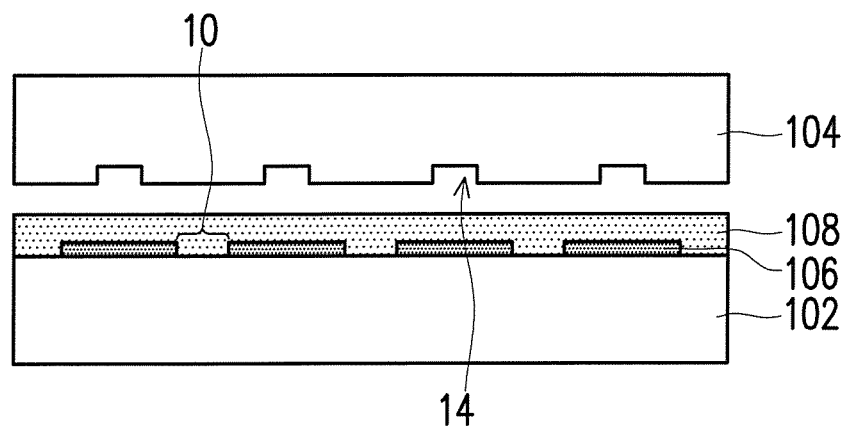
FIG. 7A and FIG. 7B are schematic cross-sectional views of a process for manufacturing the bonding structure according to a first embodiment of the disclosure.
Figure 7B:
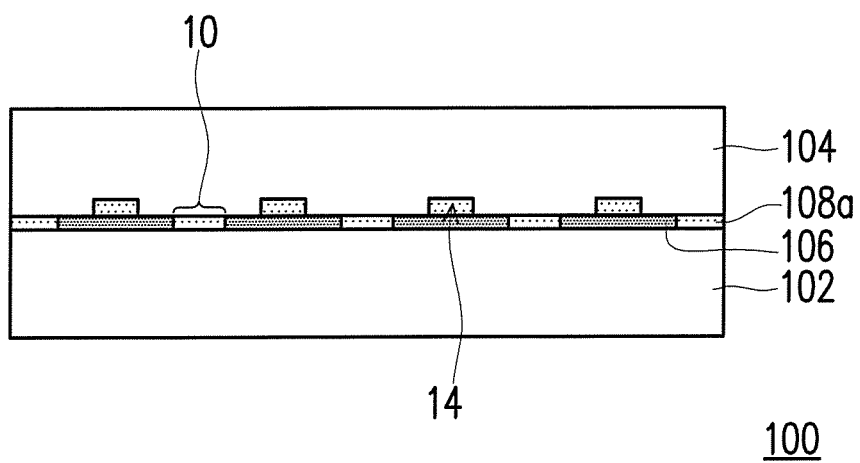
Figure 8A:
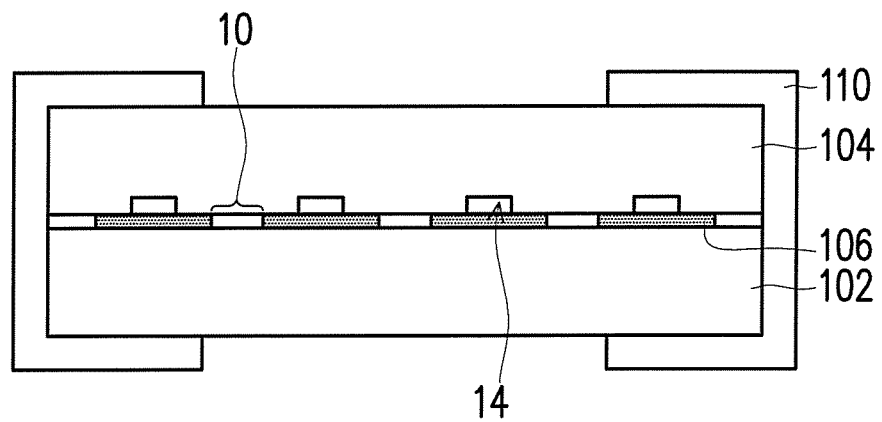
FIG. 8A and FIG. 8B are schematic cross-sectional views of a process for manufacturing the bonding structure according to a second embodiment of the disclosure.
Figure 8B:
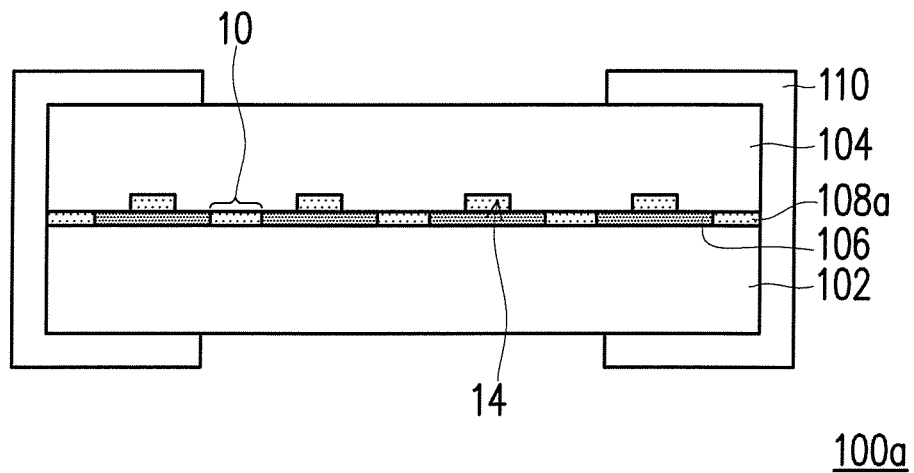
Figure 17:
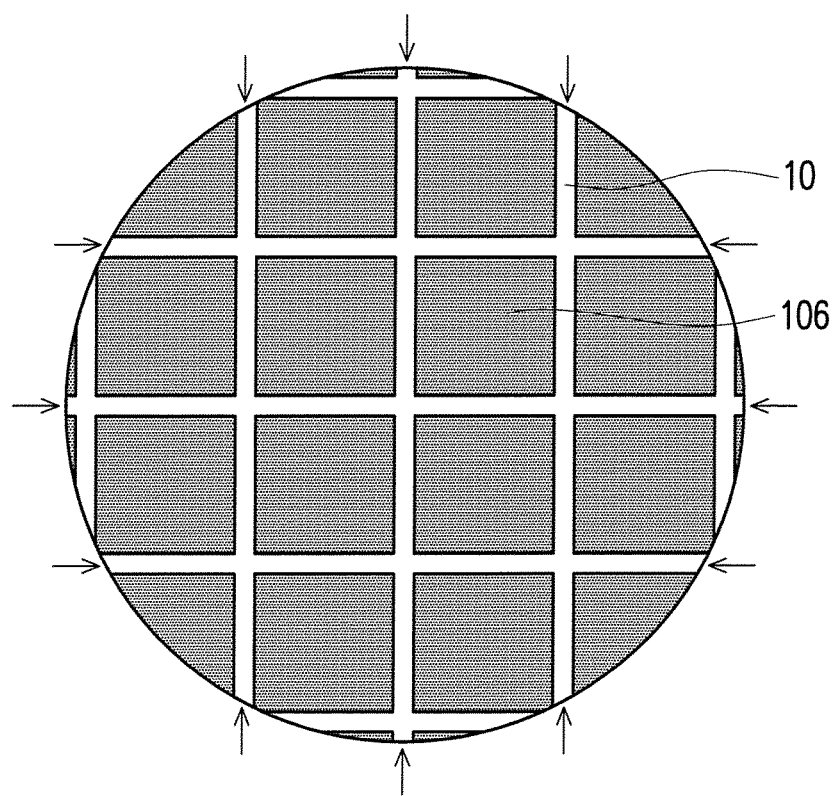
FIG. 17 is a top view of the first substrate depicted in FIG. 7A and FIG. 8A.

FIG. 7A and FIG. 7B are schematic cross-sectional views of a process for manufacturing the bonding structure according to a first embodiment of the disclosure. FIG. 8A and FIG. 8B are schematic cross-sectional views of a process for manufacturing the bonding structure according to a second embodiment of the disclosure. FIG. 17 is a top view of the first substrate depicted in FIG. 7A and FIG. 8A.

With reference to FIG. 7A, a first substrate 102 and a second substrate 104 are provided. In the embodiment, the first substrate 102 may be a wafer (e.g., the wafer 102 hereinafter). In other embodiments of the disclosure, the first substrate 102 may be a circuit board, for instance. The wafer 102 has a plurality of scribe lines 10. Device portions 106 are arranged among the scribe lines 10. In a cross-sectional view as exemplarily provided in FIG. 7A, the scribe lines 10 and the device portions 106 are alternately arranged. In a top view as exemplarily provided in FIG. 17, the scribe lines 10 have a plurality of columns and a plurality of rows, such that the device portions 106 are arranged in an array.

In the embodiment, the second substrate 104 may be a carrier, a wafer, a circuit board, or a combination thereof, for instance. The second substrate 104 has a plurality of trenches 14. The trenches 14 are correspondingly arranged above the device portions 106, and the trenches 14 and the scribe lines 10 are alternately arranged. The trenches 14 may constitute a discontinuous structure (as depicted in FIG. 2) or a continuous structure (as depicted in FIG. 3 to FIG. 6). A method for forming the trenches 14 may be a dry etching process or a wet etching process, for instance. In an embodiment of the disclosure, a depth of each trench 14 is from 1 µm to 10 µm, for instance. However, the disclosure is not limited thereto, and the depth of each trench 14 may be determined according to actual users' demands as long as the depth is less than the thickness of the second substrate 104.

A first adhesive material layer 108 is formed on the wafer 102. The scribe lines 10 are filled with and the device portions 106 are covered with the first adhesive material layer 108. In an embodiment of the disclosure, a material of the first adhesive material layer 108 includes a thermal curing material which may be polyimide, epoxy resin, or a combination thereof, for instance. A method of forming the first adhesive material layer 108 includes a spin coating process, a dry film lamination process, a needle coating process, a needle dispensing process, or a combination thereof.

With reference to FIG. 7A and FIG. 7B, the wafer 102 is bonded to the second substrate 104. After being bonded, the trenches 14 are correspondingly arranged above the device portions 106, and the trenches 14 and the scribe lines 10 are alternately arranged. A curing process is then performed on the first adhesive material layer 108, so as to form the first adhesive layer 108*a* between the wafer 102 and the second substrate 104. In an embodiment of the disclosure, the curing process may be a thermal curing process, for instance. The first adhesive material layer 108 is made of the thermal curing material, so as to prevent the bonding structure from being cracked during a thermal cycling process. In addition, the high hardness of the first adhesive layer 108*a* is conducive to an increase in the hardness of the bonding structure 100.

With reference to FIG. 7B, the bonding structure 100 provided in the first embodiment of the disclosure includes a first substrate 102, a second substrate 104, and a first adhesive layer 108*a*. In the embodiment, the first substrate 102 may be a wafer (e.g., the wafer 102 hereinafter). The wafer 102 has a plurality of scribe lines 10. Device portions 106 are arranged among the scribe lines 10. The second substrate 104 has a plurality of trenches 14. The trenches 14 are correspondingly arranged above the device portions 106, and the trenches 14 intersect the scribe lines 10. The first adhesive layer 108*a* is located between the wafer 102 and the second substrate 104. Surfaces of the device portions 106 and the scribe lines 10 are filled with the first adhesive layer 108*a*, and so are the trenches 14.

FIG. 8A and FIG. 8B are schematic cross-sectional views of a process for manufacturing the bonding structure according to a second embodiment of the disclosure.

With reference to FIG. 8A and FIG. 8B, the bonding structure 100*a* provided in the second embodiment is similar to the bonding structure 100 provided in the first embodiment; however, the first and second substrates 102 and 104 are bonded in a different manner according to the second embodiment. In the second embodiment, a fixture 110 is employed to bond the first and second substrates 102 and 104. The fixture 110 may be applied to fix the locations of the first substrate 102 and the second substrate 104. In the method, the first substrate 102 and the second substrate 104 are temporarily secured by the fixture 110. The trenches 14 are correspondingly arranged above the device portions 106, and the trenches 14 intersect the scribe lines 10.

With reference to FIG. 8B, a first adhesive layer 108*a* is formed between the wafer 102 and the second substrate 104. In an embodiment of the disclosure, a method of forming the first adhesive layer 108*a* is to fill space between the wafer 102 and the second substrate 104 with a first adhesive material layer (not shown). For instance, the peripheries of the bonding structure 100 and/or the gaps between the wafer 102 and the second substrate 104 may be filled with the first adhesive material layer. The first adhesive material layer may enter the center of the bonding structure 100*a* (as shown in FIG. 17) from the edges of the bonding structure 100 along the scribe lines 10 or the trenches 14. A curing process is then performed on the first adhesive material layer, so as to form the first adhesive layer 108*a* between the wafer 102 and the second substrate 104.

Figure 9A:
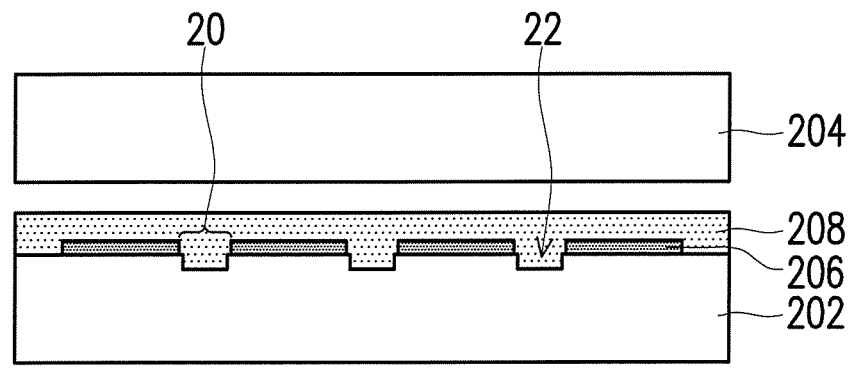
FIG. 9A and FIG. 9B are schematic cross-sectional views of a process for manufacturing the bonding structure according to a third embodiment of the disclosure.
Figure 9B:
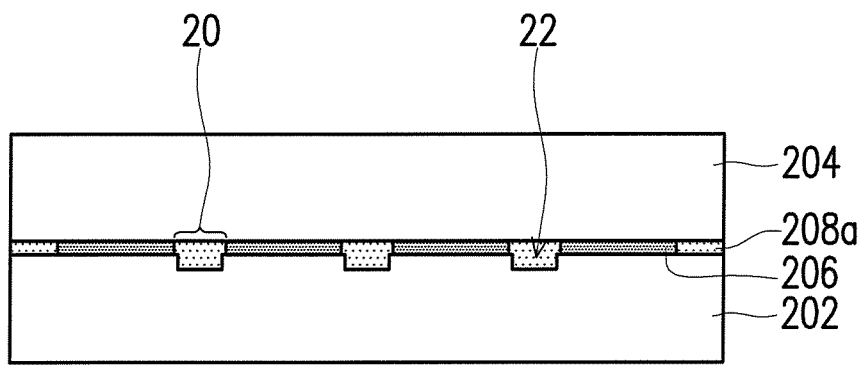

FIG. 9A and FIG. 9B are schematic cross-sectional views of a process for manufacturing the bonding structure according to a third embodiment of the disclosure.

Figure 13A:
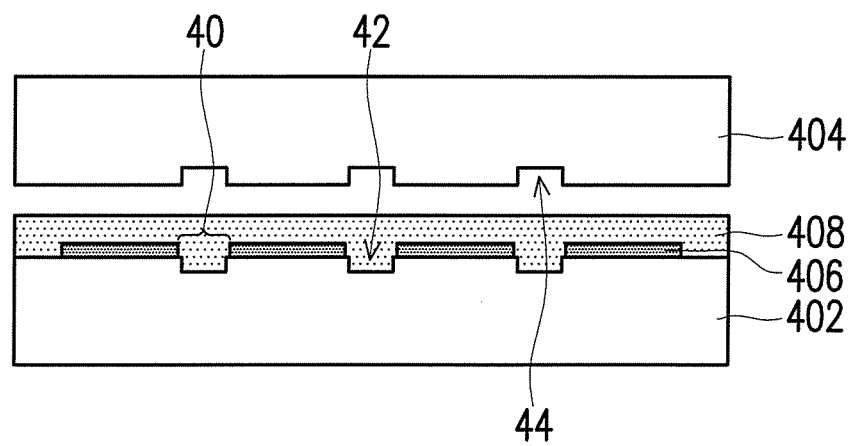
FIG. 13A and FIG. 13B are schematic cross-sectional views of a process for manufacturing the bonding structure according to a seventh embodiment of the disclosure.
Figure 14A:
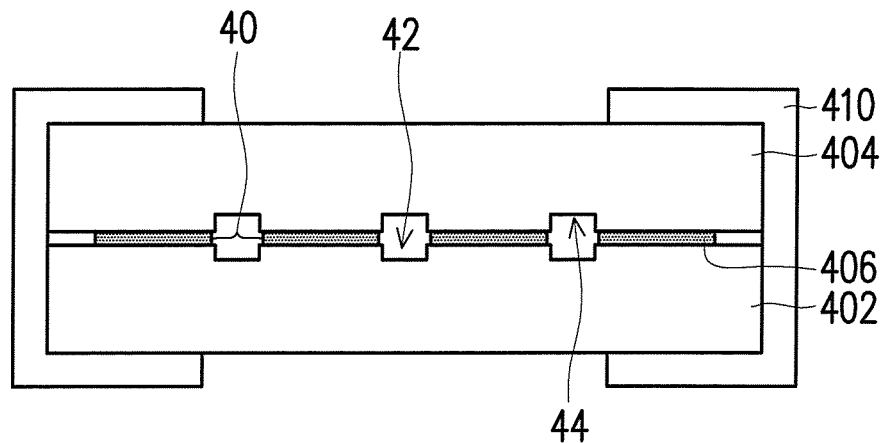
FIG. 14A and FIG. 14B are schematic cross-sectional views of a process for manufacturing the bonding structure according to an eighth embodiment of the disclosure.

Identical or similar reference numbers represent the identical or similar devices, components, and layers in the following embodiments. For instance, the first substrate 202 illustrated in FIG. 9A and FIG. 10A, the first substrate 302 illustrated in FIG. 11A and FIG. 12A, and the first substrate 402 illustrated in FIG. 13A and FIG. 14A are identical or similar to the first substrate 102 illustrated in FIG. 7A. Therefore, the descriptions of the first substrate 102 will not be further provided hereinafter.

With reference to FIG. 9A, the bonding structure 200 provided in the third embodiment is similar to the bonding structure 100 provided in the first embodiment; however, in the third embodiment, the second substrate 204 of the bonding structure 200 does not have the trenches, and the first substrate 202 has a plurality of trenches 22. Here, the trenches 22 are located in the scribe lines 20.

With reference to FIG. 9A, in the embodiment, the first substrate 202 may be a wafer (e.g., the wafer 202 hereinafter). The structure of the trenches 22, the shape thereof, and the forming method of the trenches 22 are similar to those of the trenches 12 provided above and are already described in the previous embodiments; hence, no further description is provided hereinafter. In an embodiment of the disclosure, a depth of each trench 22 is from 1 µm to 10 µm, for instance. However, the disclosure is not limited thereto, and the depth of each trench 22 may be determined according to actual users' demands as long as the depth is less than the thickness of the wafer 202. The width of each trench 22 may be equal to or less than the width of each scribe line 20. In an embodiment of the disclosure, the width of each trench 22 is from 1 µm to 10 µm, for instance.

With reference to FIG. 9A, a first adhesive material layer 208 is formed on the wafer 202. The scribe lines 20, the trenches 22, and the device portions 206 are filled with the first adhesive material layer 208.

With reference to FIG. 9A and FIG. 9B, the wafer 202 is bonded to the second substrate 204. A curing process is then performed on the first adhesive material layer 208, so as to the first adhesive layer 208*a* between the wafer 202 and the second substrate 204. The detailed description of the curing process is given above and thus will not be further provided below.

The scribe lines of the wafer in a normal semiconductor are merely equipped with marks or alignment patterns;

however, in the embodiment of the disclosure, the scribe lines 20 of the wafer 202 further include a plurality of trenches 22. The air bubbles or the elevations in the first adhesive material layer 208 may be temporarily stored in the trenches 22 or may be removed from the first adhesive material layer 208 along the trenches 22 while the wafer 202 and the second substrate 204 are bonded to each other. Hence, in a subsequent curing process, the air bubbles or the elevations do not cause damages to the bonding structure or the warp of the bonding structure even though the first adhesive material layer 208 may be thermally expanded and contracted. In addition, said issue may be resolved according to the embodiment without modifying the design of the wafer 202 nor changing the area occupied by the wafer 202.

Figure 10A:
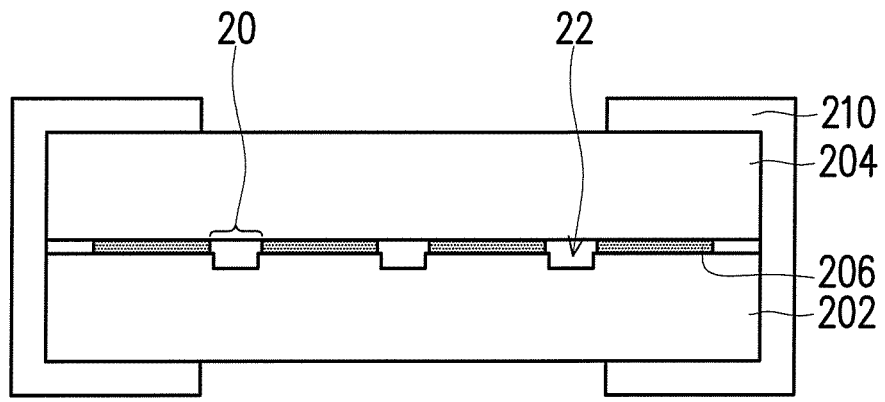
FIG. 10A and FIG. 10B are schematic cross-sectional views of a process for manufacturing the bonding structure according to a fourth embodiment of the disclosure.
Figure 10B:
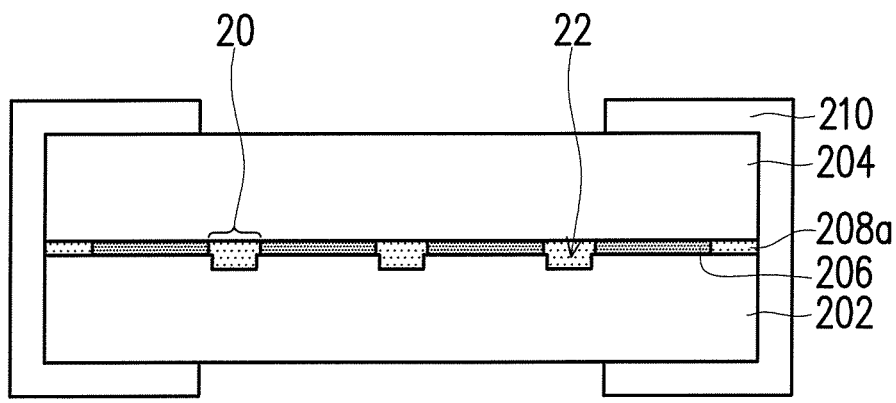

FIG. 10A and FIG. 10B are schematic cross-sectional views of a process for manufacturing the bonding structure according to a fourth embodiment of the disclosure.

With reference to FIG. 10A and FIG. 10B, the bonding structure 200a provided in the fourth embodiment is similar to the bonding structure 200 provided in the third embodiment; however, the method of manufacturing the bonding structure 200a is different from the method of manufacturing the bonding structure 200. The method of manufacturing the bonding structure 200a provided in the fourth embodiment is similar to that depicted in FIG. 8A and FIG. 8B and thus will not be further explained hereinafter.

Figure 11A:
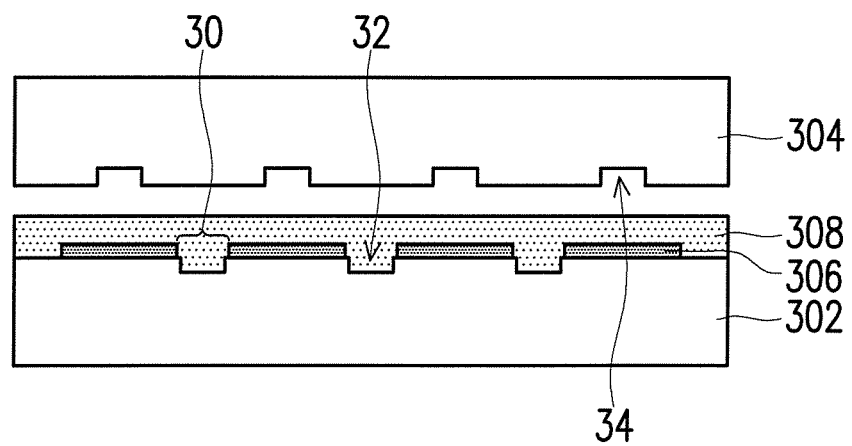
FIG. 11A and FIG. 11B are schematic cross-sectional views of a process for manufacturing the bonding structure according to a fifth embodiment of the disclosure.
Figure 11B:
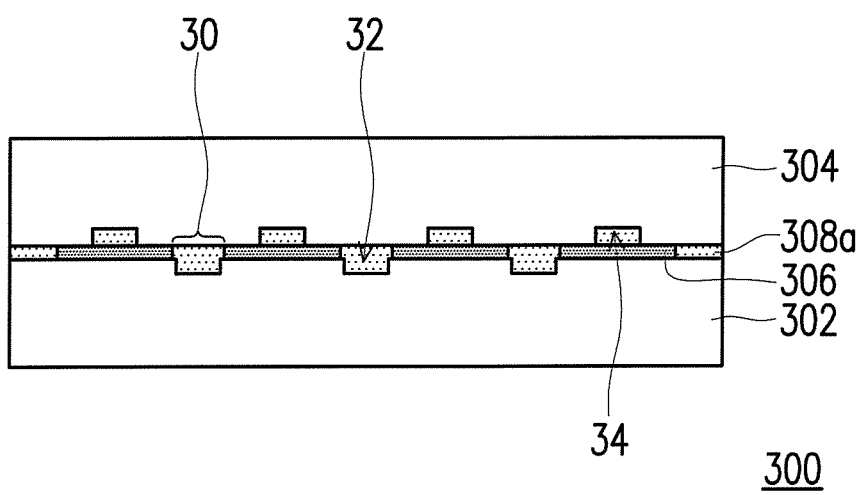

FIG. 11A and FIG. 11B are schematic cross-sectional views of a process for manufacturing the bonding structure according to a fifth embodiment of the disclosure. With reference to FIG. 11A and FIG. 11B, the bonding structure 300 provided in the fifth embodiment is similar to the bonding structure 100 provided in the first embodiment; however, in the bonding structure 300 provided in the fifth embodiment, the first substrate 302 has a plurality of trenches 32, and the second substrate 304 has a plurality of trenches 34. The trenches 32 are located in the scribe lines 30. The trenches 34 are located in the second substrate 304 and correspondingly arranged above the device portions 306, and the trenches 34 intersect the trenches 32. The method of manufacturing the bonding structure 300 provided in the fifth embodiment is similar to that depicted in FIG. 7A and FIG. 7B and thus will not be further explained hereinafter.

Figure 12A:
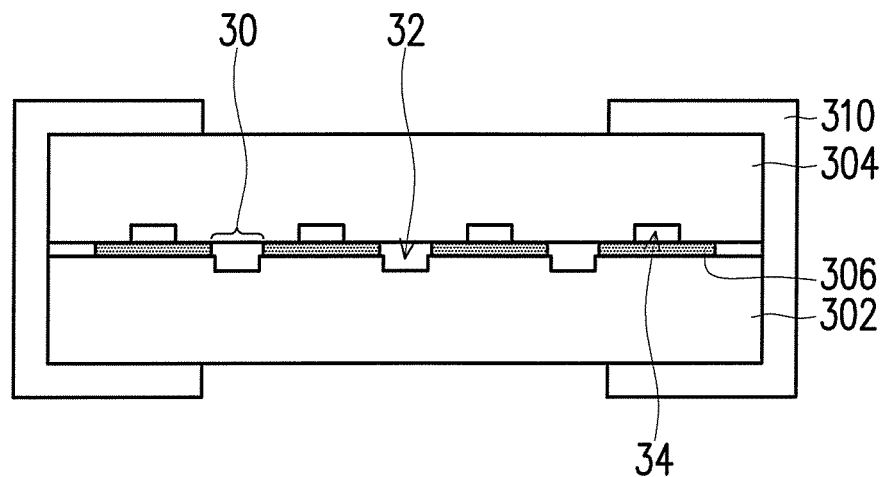
FIG. 12A and FIG. 12B are schematic cross-sectional views of a process for manufacturing the bonding structure according to a sixth embodiment of the disclosure.
Figure 12B:
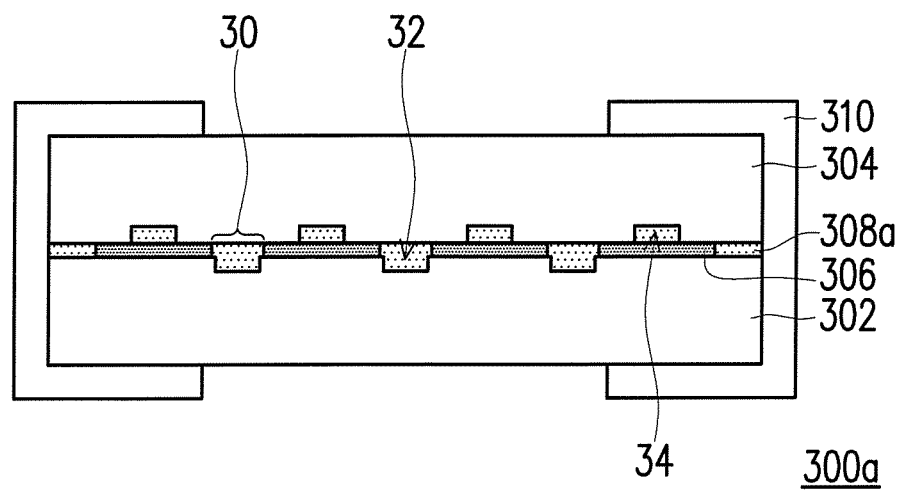

FIG. 12A and FIG. 12B are schematic cross-sectional views of a process for manufacturing the bonding structure according to a sixth embodiment of the disclosure. With reference to FIG. 12A and FIG. 12B, the bonding structure 300a provided in the sixth embodiment is similar to the bonding structure 300 provided in the fifth embodiment; however, the method of manufacturing the bonding structure 300a is different from the method of manufacturing the bonding structure 300. The method of manufacturing the bonding structure 300a provided in the sixth embodiment is similar to that depicted in FIG. 8A and FIG. 8B and thus will not be further explained hereinafter.

Figure 13B:
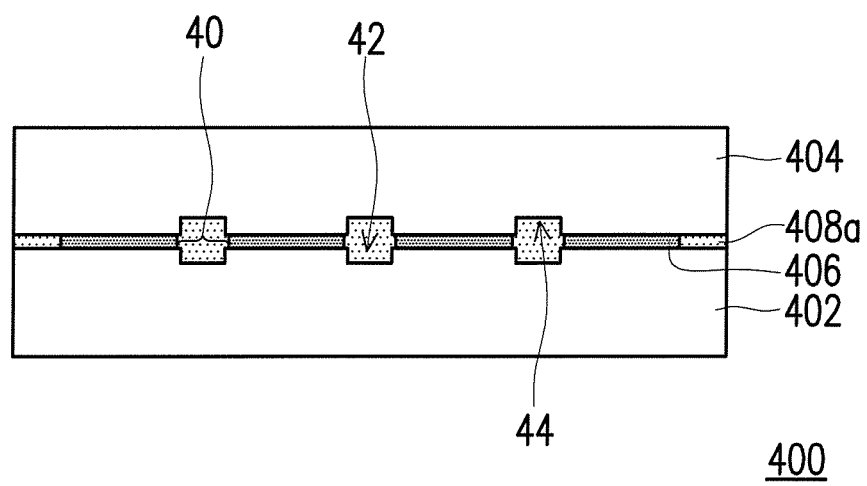

FIG. 13A and FIG. 13B are schematic cross-sectional views of a process for manufacturing the bonding structure according to a seventh embodiment of the disclosure.

With reference to FIG. 13A and FIG. 13B, the bonding structure 400 provided in the seventh embodiment is similar to the bonding structure 100 provided in the first embodiment; however, in the seventh embodiment, the scribe lines 40 of the first substrate 402 of the bonding structure 400 have a plurality of trenches 42, and the second substrate 404 has a plurality of trenches 44. The trenches 44 and the device portions 406 are alternately arranged, and the trenches 42 correspond to the trenches 44. The method of manufacturing the bonding structure 400 provided in the seventh embodiment is similar to that depicted in FIG. 7A and FIG. 7B and thus will not be further explained hereinafter.

Figure 14B:
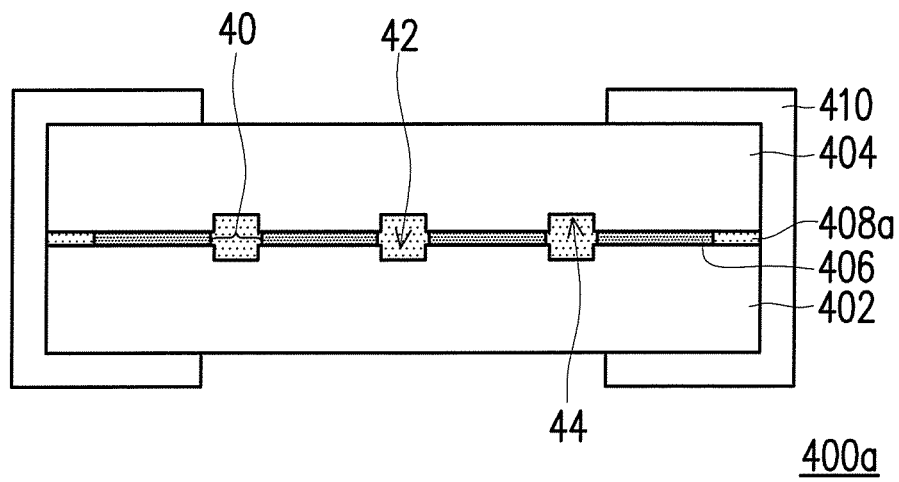

FIG. 14A and FIG. 14B are schematic cross-sectional views of a process for manufacturing the bonding structure according to an eighth embodiment of the disclosure. With reference to FIG. 14A and FIG. 14B, the bonding structure 400a provided in the eighth embodiment is similar to the bonding structure 400 provided in the seventh embodiment; however, the method of manufacturing the bonding structure 400a is different from the method of manufacturing the bonding structure 400. The method of manufacturing the bonding structure 400a provided in the eighth embodiment is similar to that depicted in FIG. 8A and FIG. 8B and thus will not be further explained hereinafter.

In addition to the bonding structures 100, 100a, 200, 200a, 300, 300a, 400, and 400a respectively described in the first embodiment to the eighth embodiment, it could be mentioned that the first substrate may be a wafer, and the second substrate may also be a wafer according to another embodiment of the disclosure. Both wafers have a plurality of scribe lines, and device portions are located among the scribe lines. In addition, both wafers have the trenches; the trenches may be arranged in the scribe lines of both wafers or in the scribe lines of one of the wafers.

Figure 15A:
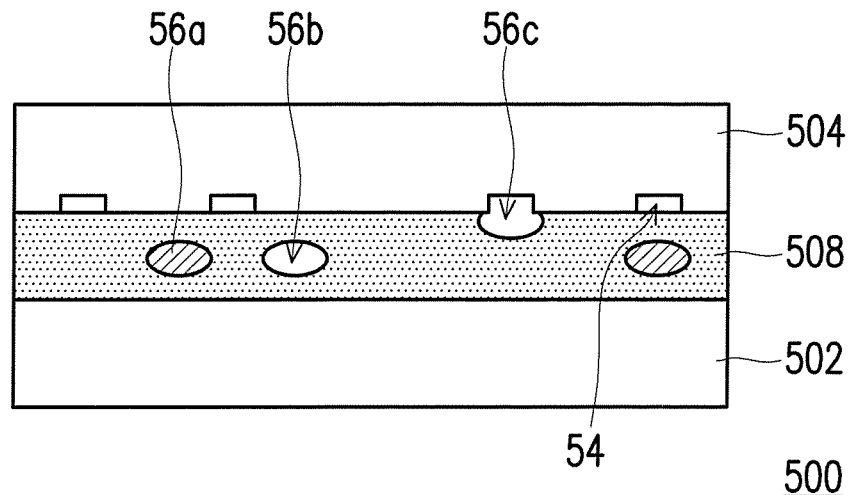
FIG. 15A and FIG. 15B are schematic cross-sectional views of a process for manufacturing the bonding structure according to a ninth embodiment of the disclosure.
Figure 15B:
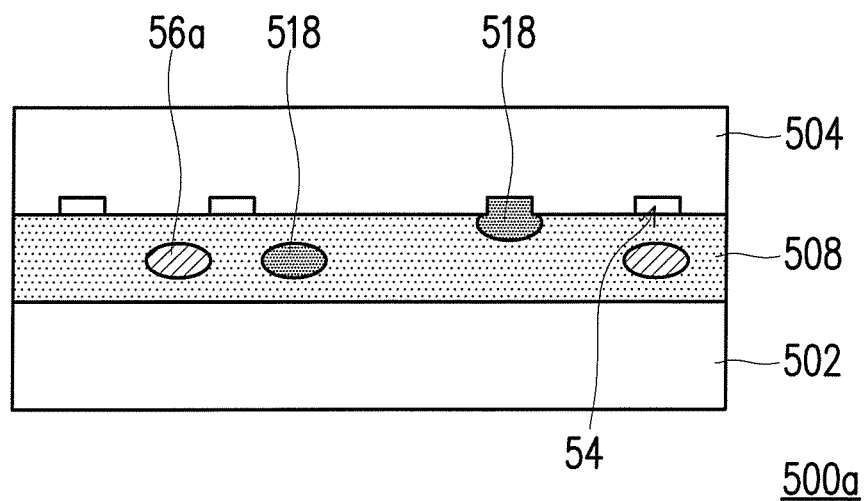

FIG. 15A and FIG. 15B are schematic cross-sectional views of a process for manufacturing the bonding structure according to a ninth embodiment of the disclosure.

With reference to FIG. 15A and FIG. 15B, the embodiment is applicable to a bonding structure 500. The bonding structure 500 includes a first substrate 502, a second substrate 504, and a first adhesive layer 508. The second substrate 504 has a plurality of trenches 54. A first adhesive layer 508 is already formed between the first substrate 502 and the second substrate 504. The first adhesive layer 508 may have particles 56a and air bubbles 56b and 56c (as shown in FIG. 15A) during the adhesion process, and thus the bonding structure 500 may be distorted or warped. With reference to FIG. 15B, a second adhesive layer 518 is further formed between the first substrate 502 and the second substrate 504. In an embodiment of the disclosure, a method of forming the second adhesive layer 518 is to fill space between the first substrate 502 and the second substrate 504 with a second adhesive material layer (not shown). For instance, the peripheries of the bonding structure 500 and/or the gaps between the first substrate 502 and the second substrate 504 may be filled with the second adhesive material layer. The second adhesive material layer may enter the air bubbles 56b and 56c from the edges of the bonding structure 500 along the trenches 54. A curing process is then performed on the second adhesive material layer, so as to form the second adhesive layer 518 between the first substrate 502 and the second substrate 504.

FIG. 16A to FIG. 16D are schematic cross-sectional views of a process for manufacturing the bonding structure according to a tenth embodiment of the disclosure.

Figure 16A:
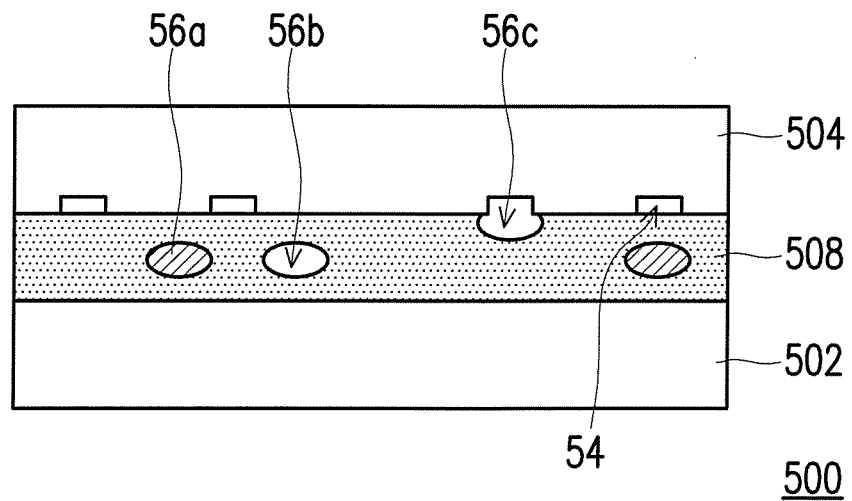
FIG. 16A to FIG. 16D are schematic cross-sectional views of a process for manufacturing the bonding structure according to a tenth embodiment of the disclosure.
Figure 16B:
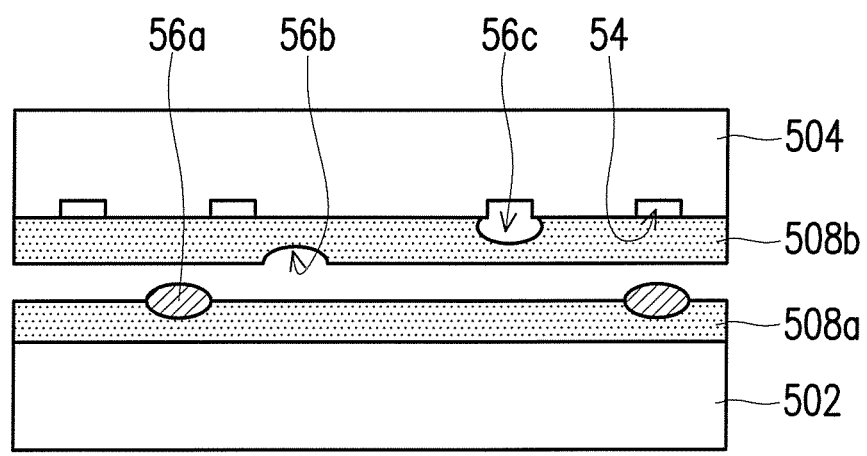

With reference to FIG. 16A and FIG. 16B, the embodiment is also applicable to the bonding structure 500 in which two carriers are already bonded to each other by the adhesive layer 508; however, the method of forming the second adhesive material layer 518 provided herein is different from the method of forming the second adhesive material layer provided in the ninth embodiment. As shown in FIG. 16A and FIG. 16B, after a de-bonding process is performed on the bonding structure 500, the first substrate 502 is separated from the second substrate 504, and the first adhesive layer 508 is divided into a first portion 508a and a second portion 508b. A surface of the first substrate 502 is filled with the first portion 508a, and a surface of the second substrate 504 is filled with the second portion 508b, as shown in FIG. 16B. Compared to the normal plate (e.g., a carrier) having no trenches, the second substrate 504 has the trenches 54, and the surface area where the first adhesive layer 508 is in contact with the second substrate 504 is relatively small. Therefore, during the de-bonding process, it is easy for the second substrate 504 to be separated from the first substrate 502. As such, the first and second substrates 502 and 504 are not broken during the de-bonding process.

Figure 16C:
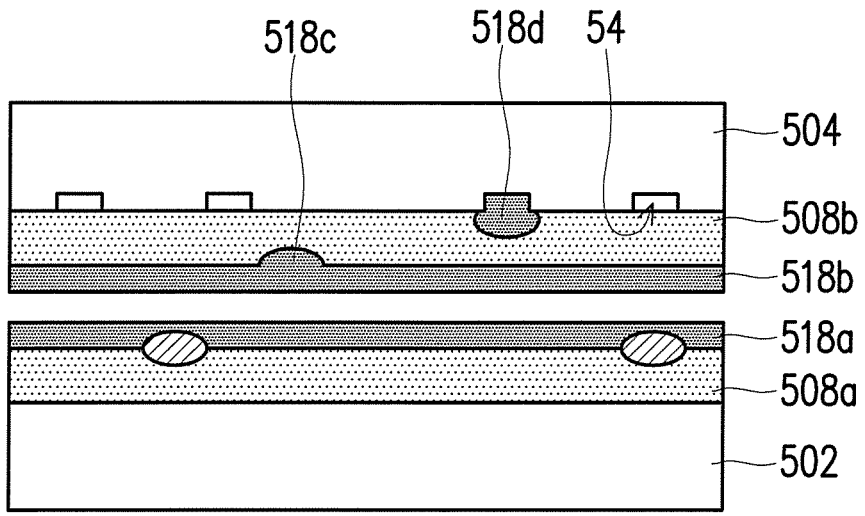

With reference to FIG. 16C, a second adhesive material layer 518a is formed on a surface of the first portion 508a; simultaneously, a second adhesive material layer 518b is formed on a surface of the second portion 508b. In an embodiment of the disclosure, the air bubbles 56b and 56c may be respectively filled with second adhesive material layers 518c and 518d from the edges of the bonding structure 500 along the trenches 54.

Figure 16D:
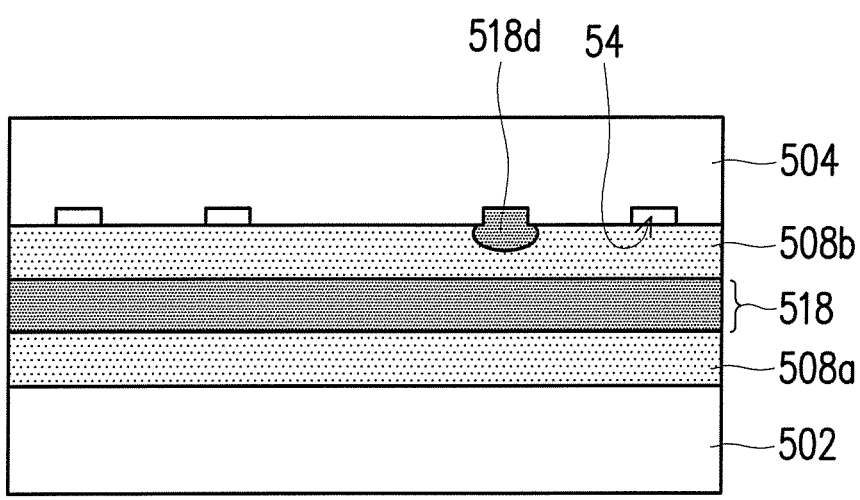

With reference to FIG. 16C and FIG. 16D, the first substrate 502 and the second substrate 504 are adhered to each other, such that the second adhesive material layers 518a and 518b are in contact with each other. A curing process is then performed to cure the second adhesive material layers 518a and 518b, so as to form the second adhesive layer 518 between the first substrate 502 and the second substrate 504.

Figure 18A:
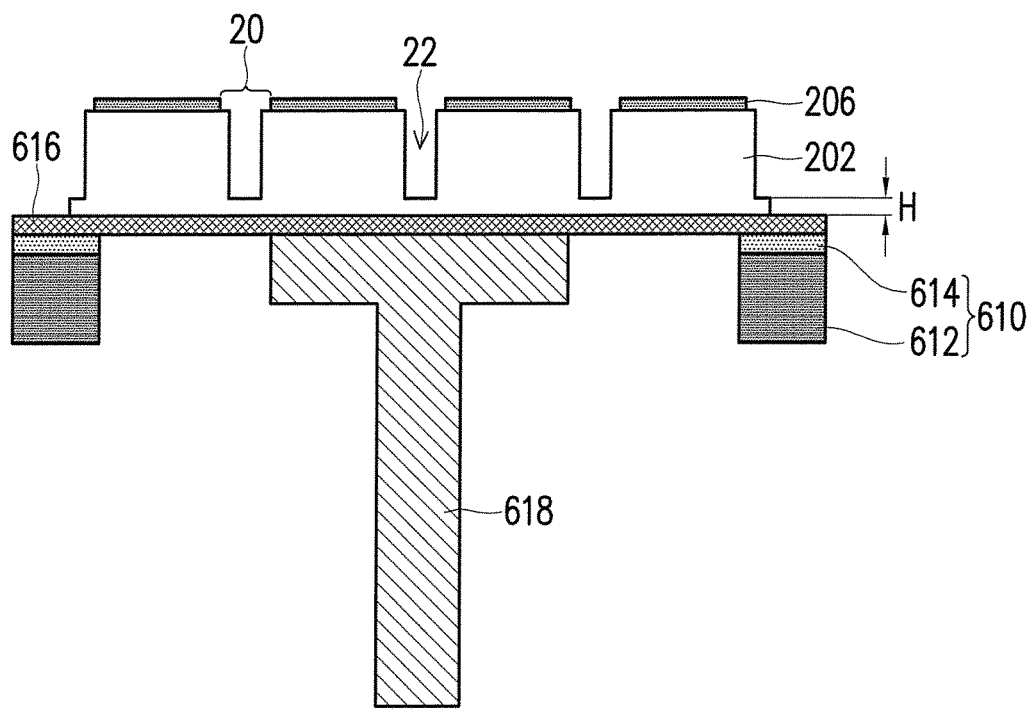
FIG. 18A to FIG. 18C are schematic cross-sectional views of a breaking process.
Figure 18B:
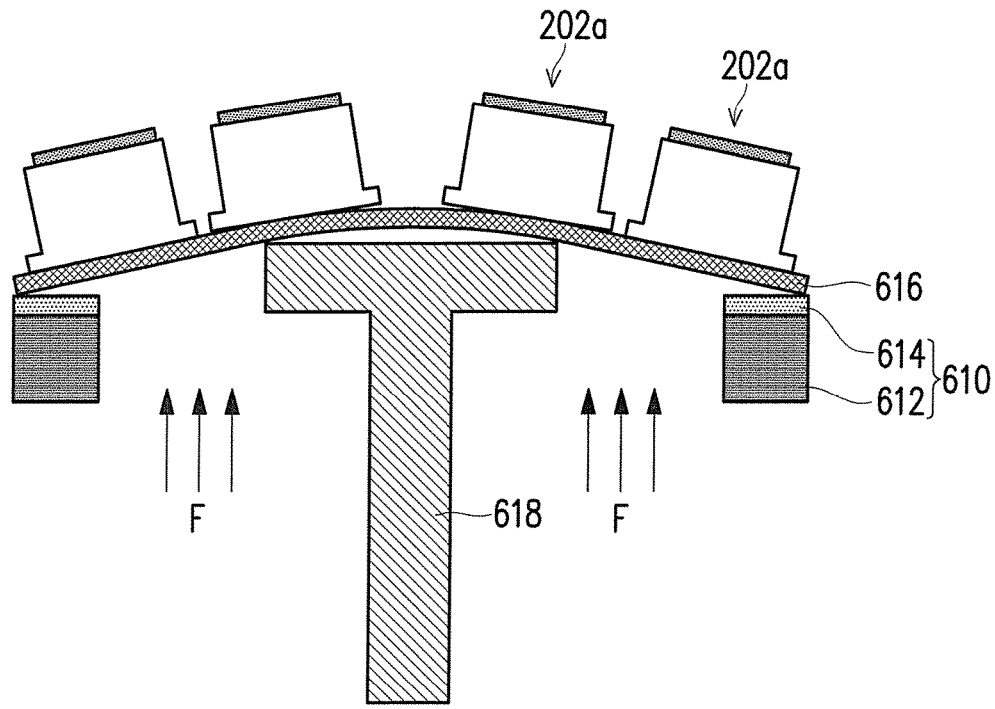
Figure 18C:
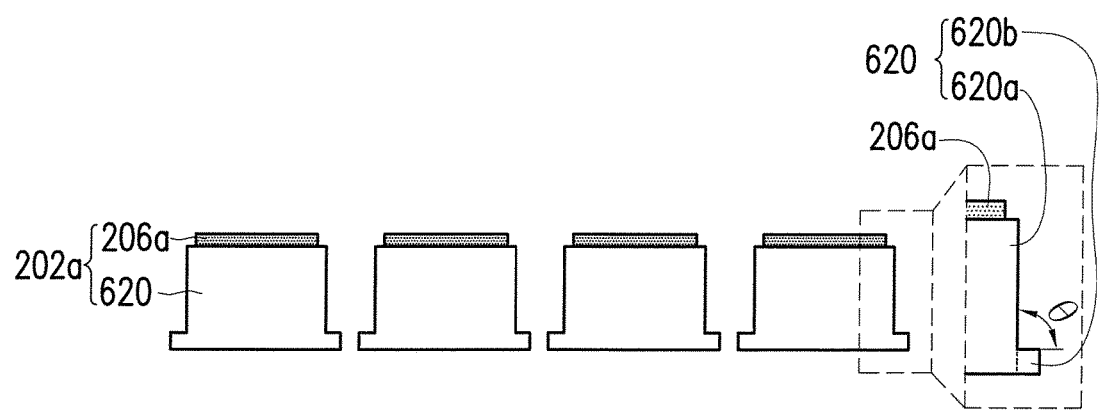

FIG. 18A to FIG. 18C are schematic cross-sectional views of a breaking process.

With reference to FIG. 18A to FIG. 18C, the breaking process may be performed by an expanding machine. Here, a de-bonding process may be performed on the bonding structure 200 (shown in FIG. 9B and described in the third embodiment), and the first adhesive layer 208a is removed; after that, the remaining first substrate (wafer) 202 (the wafer 202 hereinafter) may be applied to explain the breaking process. The wafer 202 has a plurality of scribe lines 20 and a plurality of trenches 22. Device portions 206 are arranged among the scribe lines 20. The trenches 22 are located in the scribe lines 20. In an embodiment of the disclosure, a distance H between bottom surfaces of the trenches 22 to a bottom surface of the wafer 202 may be less than 10 μm. In another embodiment of the disclosure, the distance H between the bottom surfaces of the trenches 22 to the bottom surface of the wafer 202 may be less than 5 μm. In yet another embodiment of the disclosure, the distance H between the bottom surfaces of the trenches 22 to the bottom surface of the wafer 202 may be less than 1 μm.

The breaking process may be performed on the wafer 202 by an expanding machine. The expanding machine includes a fixing stage 610 and an expansion component 618. The fixing stage 610 may include a fixing structure 612 and a fixing ring 614. The fixing ring 614 is arranged on the fixing structure 612, and the wafer is arranged on the fixing stage 610. A protection layer 616 may be arranged between the wafer 202 and the fixing table 610, so as to protect the wafer 202. In an embodiment of the disclosure, the protection layer 616 may be release paper, a release film, a polymer film, or a combination thereof, for instance. The release film may be a blue tape, for instance.

With reference to FIG. 18A and FIG. 18B, the expansion component 618 exerts a force F to the protection layer 616. The force F cracks the wafer 202 on the protection layer 616 from the bottom surfaces of the trenches 22, so as to form a plurality of dies 202a.

With reference to FIG. 18A and FIG. 18C, the wafer 202 has the trenches 22; therefore, after the breaking process is performed, sidewalls of the resultant dies 202a are step-shaped.

As shown in FIG. 18C, specifically, each of the dies 202a includes a substrate 620 and a device portion 206a. The device portion 206a is located on the substrate 620. Here, the device portion 206a is the device portion described in the first embodiment, for instance.

The substrate 620 is, for instance, a semiconductor substrate, such as a silicon substrate. A sidewall of the substrate 620 is step-shaped. In particular, the substrate 620 includes a main portion 620a and a protruding portion 620b. The main portion 620a is located below the device portion 206a, and the protruding portion 620b is located on one portion of a sidewall of the main portion 620a. That is, the protruding portion 620b protrudes from the sidewall of the main portion 620a, such that the profile of the main portion 620a and the protruding portion 620b is step-shaped. A top surface of the protruding portion 620b constitutes parts of the bottom surfaces of the trenches 22, and the sidewall of the protruding portion 620b has a profile resulting from the breaking process. The sidewall of the main portion 620a constitutes parts of the sidewalls of the trenches 22. In an embodiment of the disclosure, the trenches 22 are formed by performing a dry etching process (anisotropic etching) or a wet etching process (isotropic etching), for instance; hence, the sidewall of the main portion 620a has the profile resulting from the etching process, e.g., a ripple-like profile, a semi-arc profile, or a flat profile. Accordingly, the profile of the sidewall of the main portion 620a is different from the profile of the sidewall of the protruding portion 620b. Besides, an angle θ is formed between the other portion of the sidewall of the main portion 620a (not in contact with the protruding portion 620b) and a top surface of the protruding portion 620b, and the angle θ is an obtuse angle or an acute angle according to the embodiment. In an embodiment of the disclosure, the angle θ ranges from 70 degrees to 135 degrees.

To sum up, the trenches are formed in one of the first substrate and the second substrate. The trenches may constitute any continuous or discontinuous structure or may be arranged in form of any pattern. During the adhesion of the first and second substrates, the trenches allow the air bubbles or the elevations in the adhesive material layer to be reduced, so as to prevent damages to the bonding structure or the warp of the bonding structure. In addition, the trenches described herein may be located in the scribe lines; therefore, said issue may be resolved without modifying the design of the wafer or the carrier nor changing the area occupied by the wafer or the carrier.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A bonding structure comprising:
    a first substrate having a plurality of first trenches, wherein there is no device in the first trench;
    a second substrate having a plurality of second trenches, wherein the first substrate is a wafer, the second substrate is a carrier, and the wafer has a plurality of scribe lines, wherein device portions are arranged among the scribe lines, and the first trenches are located in the scribe lines; and an adhesive layer located between the first substrate and the second substrate, wherein the first trenches are filled with the adhesive layer.

2. The bonding structure of claim 1, wherein the second trenches correspond to the device portions, and the first trenches and the second trenches are alternately arranged.

3. The bonding structure of claim 1, wherein the first trenches and the second trenches correspond to each other.

4. The bonding structure of claim 1, wherein the first trenches constitute a continuous structure having a plurality of columns and a plurality of rows, and the columns and the rows intersect and are connected, so as to form a plurality of intersections.

5. The bonding structure of claim 4, wherein shapes of the intersections are the same.

6. The bonding structure of claim 4, wherein shapes of the intersections are different.

7. The bonding structure of claim 1, wherein the first trenches constitute a discontinuous structure having a plurality of units, and the units are alternately arranged and are disconnected.

8. A die structure comprising:
a substrate, the substrate including a device region and a scribe line region, wherein a top surface of the substrate in the device region and a top surface of the substrate in the scribe line region has a step, the scribe line region is a trench, and the top surface of the scribe line region is bare; and
a device portion located on the device region of the substrate, wherein a sidewall of the substrate is step-shaped,
wherein no device is in the scribe line region.

9. The die structure of claim 8, wherein the substrate comprises a main portion and a protruding portion, the main portion is located below the device portion, the protruding portion is located on one portion of a sidewall of the main portion, an angle is formed between the other portion of the sidewall of the main portion and a top surface of the protruding portion, and the angle is an obtuse angle or an acute angle.

10. The die structure of claim 9, wherein the angle is from 70 degrees to 135 degrees.

11. A bonding structure comprising:
a first substrate, the first substrate is a wafer, and the wafer has a plurality of scribe lines, device portions are arranged among the scribe lines;
a second substrate having a plurality of trenches, wherein the second substrate is a carrier, there is no device in the trench, and the trenches and the scribe lines are alternately arranged; and
an adhesive layer located between the first substrate and the second substrate, wherein the trenches are filled with the adhesive layer.

12. The bonding structure of claim 11, wherein the trenches constitute a continuous structure having a plurality of columns and a plurality of rows, and the columns and the rows intersect and are connected, so as to form a plurality of intersections.

13. The bonding structure of claim 11, wherein the trenches constitute a discontinuous structure having a plurality of units, and the units are alternately arranged and are disconnected.

* * * * *